(12) United States Patent
Lee et al.

(10) Patent No.: US 10,714,698 B2
(45) Date of Patent: Jul. 14, 2020

(54) FREE-FORM DISPLAY

(71) Applicant: LG Display Co., Ltd., Seoul (KR)

(72) Inventors: Byeongil Lee, Paju-si (KR); Jongmoo Kim, Paju-si (KR); Hansol Choi, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/211,087

(22) Filed: Dec. 5, 2018

(65) Prior Publication Data

US 2019/0189940 A1 Jun. 20, 2019

(30) Foreign Application Priority Data

Dec. 18, 2017 (KR) ........................ 10-2017-0174435

(51) Int. Cl.
| | | |
|---|---|---|
| *H01L 51/00* | (2006.01) | |
| *H01L 27/32* | (2006.01) | |
| *G09G 3/3233* | (2016.01) | |
| *H01L 51/52* | (2006.01) | |

(52) U.S. Cl.
CPC ...... *H01L 51/0097* (2013.01); *H01L 27/3211* (2013.01); *H01L 27/3246* (2013.01); *H01L 27/3276* (2013.01); *H01L 51/5253* (2013.01); *G09G 3/3233* (2013.01); *G09G 2300/0452* (2013.01); *G09G 2380/02* (2013.01); *H01L 27/3244* (2013.01); *H01L 2251/5338* (2013.01)

(58) Field of Classification Search
CPC ....... G09G 2300/0452; G09G 2380/02; G09G 3/3233; H01L 2251/5338; H01L 27/3211; H01L 27/3244; H01L 27/3246; H01L 27/3276; H01L 51/0097; H01L 51/5253
See application file for complete search history.

(56) References Cited

U.S. PATENT DOCUMENTS

| | | | |
|---|---|---|---|
| 7,371,786 B2 | 5/2008 | Yoshihara et al. | |
| 2005/0038137 A1 | 2/2005 | Yoshihara et al. | |
| 2007/0268244 A1* | 11/2007 | Chopra ................... | G09G 3/344 345/107 |
| 2009/0219225 A1* | 9/2009 | Cope .......................... | G09F 9/30 345/55 |
| 2009/0286361 A1* | 11/2009 | Kawashima ........ | H01L 51/0005 438/149 |
| 2010/0143595 A1* | 6/2010 | Nara ....................... | H01L 51/00 427/299 |
| 2012/0275013 A1* | 11/2012 | Hayashi .................. | G02F 1/167 359/296 |
| 2015/0221244 A1* | 8/2015 | Miller ...................... | G09F 9/301 705/310 |
| 2016/0284774 A1* | 9/2016 | Zhang ..................... | H01L 21/77 |
| 2017/0168203 A1* | 6/2017 | Do ........................... | G02B 5/22 |
| 2017/0217143 A1* | 8/2017 | Kim ......................... | B32B 7/12 |

FOREIGN PATENT DOCUMENTS

| | | |
|---|---|---|
| KR | 10-2004-0044532 A | 5/2004 |
| KR | 10-1570852 B1 | 11/2015 |

* cited by examiner

*Primary Examiner* — Afroza Chowdhury
(74) *Attorney, Agent, or Firm* — Fenwick & West LLP

(57) ABSTRACT

The present disclosure relates to a free-form display that can freely alter its shape by connecting a plurality of micro display elements by a flexible medium. The free-form display comprises a flexible substrate, a plurality of unit pixel substrates, and a flexible medium. The unit pixel substrates are arranged in a matrix on the flexible substrate. The flexible medium fills gaps between the unit pixel substrates.

6 Claims, 5 Drawing Sheets

FREE-FORM DISPLAY

This application claims the benefit of Republic of Korea Patent Application No. 10-2017-0174435 filed on Dec. 18, 2017, which is incorporated herein by reference for all purposes as if fully set forth herein.

BACKGROUND OF THE INVENTION

Field of the Invention

The present disclosure relates to a free-form display made by connecting a plurality of micro display elements by a flexible medium to allow free alternation of its shape. More particularly, the disclosure relates to a free-form organic light-emitting diode display that implements a display function by self-emissive elements.

Related Art

Recently, various flat panel displays that are less bulky and more lightweight than cathode ray tubes (CRTs) are being developed. Examples of these flat panel displays include liquid crystal displays (LCDs), field emission displays (FEDs), plasma display panels (PDPs), electroluminescence displays (ELs), etc.

The electroluminescence displays are roughly classified into inorganic electroluminescence displays and organic light-emitting diode displays depending on materials used for emissive layers, and offer several advantages such as fast response time, high light-emission efficiency, high brightness, and wide viewing angle because they are self-emissive elements. Notably, there is a rapidly increasing demand for organic light-emitting diode displays, which have high energy efficiency and less leakage current and facilitate grayscale representation through current control.

Particularly, the organic light-emitting diode displays can be made flexible—that is, capable of being bent freely, which is one of the properties of organic materials—because their components are made of organic materials. With this advantage, the organic light-emitting diode displays are being developed as display devices that can be mounted to a surface bent along the curve of a human body, as in wearable displays. In the case of large-sized displays, the organic light-emitting diode displays are often made as display devices that have a curved shape or as display devices that can be rolled up and stored like a scroll.

However, the flexible displays that have been developed so far basically have a rectangular plate-like shape, and have limited flexibility to the extent they need to be bent or rolled up to a certain radius and carried. Thus, there are limitations in making these flexible displays as wearable displays. In order to make the flexible displays as actually wearable displays that can freely alter their shape like a cloth or fabric, it is necessary to develop a free-form display which has a higher degree of freedom.

SUMMARY OF THE DISCLOSURE

The present disclosure has been made in an effort to overcome the aforementioned problems, and an aspect of the present disclosure is to provide a free-form display with a high degree of freedom that maintains the display function even when the display is folded, crumpled, or bent repeatedly, like a fabric or cloth.

An exemplary embodiment of the present disclosure provides a free-form display comprising a flexible substrate, a plurality of unit pixel substrates, and a flexible medium. The unit pixel substrates are arranged in a matrix on the flexible substrate. The flexible medium fills gaps between the unit pixel substrates.

The free-form display further comprises connecting lines that are stacked between the flexible substrate and the flexible medium and connect the unit pixel substrates.

The free-form display further comprises: a water-repellent layer stacked over all the unit pixel substrates and an entire top surface of the flexible medium; and an antifouling film stacked over the water-repellent layer.

In each of the unit pixel substrates, a single unit pixel is placed.

The single unit pixel comprises at least three sub-pixels.

The single sub-pixel comprises an organic light-emitting diode and a thin-film transistor that drives the organic light-emitting diode.

The single unit pixel comprises a red sub-pixel, a green sub-pixel, and a blue sub-pixel.

The disclosure provides a free-form display that maintains display function properly when it is folded, bent, or even crumpled. The free-form organic light-emitting diode display according to the disclosure maintains the display function properly, even if it does not return to its original state. The free-form organic light-emitting diode display according to the present disclosure is very advantageous when it comes to applying it in wearable displays, thanks to its incredibly high degree of freedom. The disclosure may provide a free-form organic light-emitting diode display that maintains the display function properly without limiting movement of users, even when they move freely while wearing it on their clothes.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure.

In the drawings.

DESCRIPTION OF EXEMPLARY EMBODIMENTS

Figure 1:
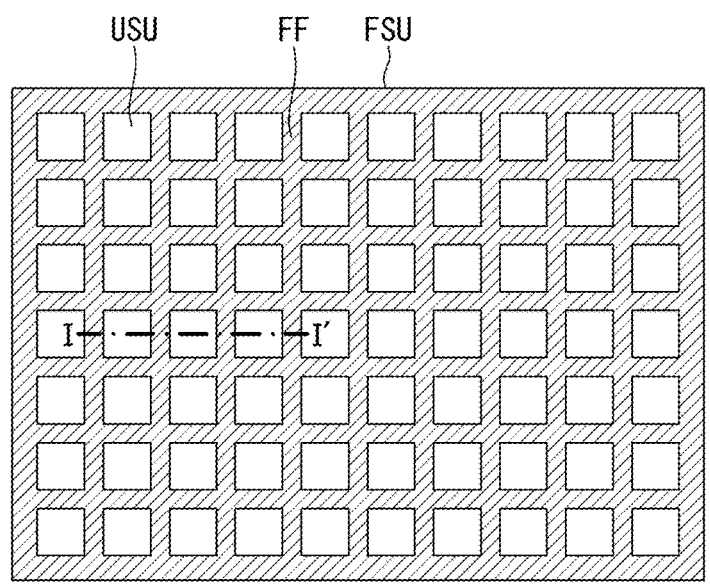
FIG. 1 is a plan view of a structure of a free-form display according to the present disclosure.

Various aspects and features of the disclosure and methods of accomplishing them may be understood more readily by reference to the following detailed descriptions of exemplary embodiments and the accompanying drawings. The disclosure may, however, be embodied in many different forms and should not be construed as being limited to the exemplary embodiments set forth herein. Rather, these exemplary embodiments are provided so that this disclosure will be thorough and complete and will fully convey the concept of the present disclosure to those skilled in the art, and the present disclosure is defined by the appended claims.

The shapes, sizes, proportions, angles, numbers, etc. shown in the figures to describe the exemplary embodiments of disclosure are merely examples and not limited to those shown in the figures. Like reference numerals denote like elements throughout the specification.

In describing the disclosure, detailed descriptions of related well-known technologies will be omitted to avoid unnecessary obscuring the disclosure. When the terms 'comprise', 'have', and the like are used, other parts may be added as long as the term 'only' is not used. The singular forms may be interpreted as the plural forms unless explicitly stated.

The elements may be interpreted to include an error margin even if not explicitly stated. When the position relation between two parts is described using the terms "on", "over", "under", "next to" and the like, one or more parts may be positioned between the two parts as long as the term "immediately" or "directly" is not used.

It will be understood that, although the terms "first", "second", etc. may be used herein to describe various elements, these elements are not limited by these terms. These terms are used to distinguish one element from another element. The terms and names of elements used herein are chosen for ease of description and may be different from the names of parts used in actual products.

The features of various exemplary embodiments of the disclosure may be coupled or combined with one another either partly or wholly, and may technically interact or work together in various ways. The exemplary embodiments may be carried out independently or in connection with one another.

Hereinafter, various exemplary embodiments of the disclosure will be described in detail with reference to the accompanying drawings. In the exemplary embodiments below, the description of an electroluminescence display will focus on an organic light-emitting diode display comprising organic light-emitting material. However, it should be noted that the technical idea of the disclosure is not limited the organic light-emitting displays but also may apply to inorganic light-emitting displays comprising inorganic light-emitting material. Moreover, other flat panel displays, as well as electroluminescence displays, may be applied in the manufacture of free-form displays.

Figure 2:
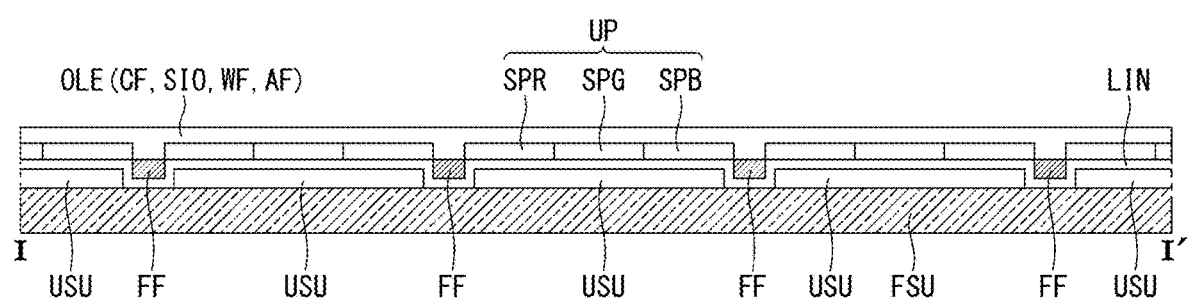
FIG. 2 is a cross-sectional view of the structure of the free-form display according to the disclosure, taken along the line I-I' of FIG. 1.

Hereinafter, a schematic structure of a free-form display according to the disclosure will be described with reference to FIGS. 1 and 2. FIG. 1 is a plan view of a structure of a free-form display according to the disclosure. FIG. 2 is a cross-sectional view of the structure of the free-form display according to the disclosure, taken along the line I-I' of FIG. 1.

The free-form display according to the disclosure comprises a plurality of unit pixel substrates USU, connecting lines LIN connecting the unit pixel substrates USU, a flexible medium FF that fills the gaps between the unit pixel substrates USU, and a flexible substrate FSU that fixes the unit pixel substrates USU and the flexible medium FF. A plurality of unit pixel substrates USU are arranged in a matrix at regular intervals on the flexible substrate FSU. The flexible medium FSU fills the gaps between the unit pixel substrates USU.

The unit pixel substrates USU are made of glass, metal, or plastic with a thickness of about 0.1 mm. The unit pixel substrates USU have a size corresponding to a single unit pixel UP of a typical flat panel display. For example, in the case of an organic light-emitting diode display with a diagonal size of 5 inches and a resolution of 400 ppi, the unit pixel UP may be a square whose one side measures 50 µm to 70 µm. In the case of a free-form organic light-emitting diode display with similar dimensions to that of the organic light-emitting diode display, the unit pixel substrate USU may have a square shape whose one side measures about 50 µm to 70 µm.

The connecting lines LIN extend horizontally and vertically and are arranged on the unit pixel substrates USU, and electrically connect the unit pixels UP formed on the respective unit pixel substrates USU. The unit pixels UP are formed on the connecting lines LIN which run across the unit pixel substrates USU. A single unit pixel UP is placed in each unit pixel substrate USU. The single unit pixel UP comprises a red sub-pixel SPR, a green sub-pixel SPG, and a blue sub-pixel SPB. Although not shown, the unit pixel UP may further comprise a white sub-pixel.

The unit pixel substrates USU are arrayed on the same horizontal plane. The flexible medium FF fills the gaps between the unit pixel substrates USU. The flexible medium FF is preferably made of a highly stretchable material such as an elastomeric polymer. For example, the flexible medium FF may comprise polydimethylsiloxane, which is a type of silicone oil.

The flexible substrate FSU is attached to the bottom surfaces of the unit pixel substrates USU and the flexible medium FF. From another perspective, the unit pixel substrates USU and the flexible medium FF may be attached to the top surface of the flexible substrate FSU. It is desirable that the flexible substrate FSP also be made of an elastomeric polymer such as polydimethylsiloxane, which is the same material as used in the flexible medium FSU.

The flexible medium FF and the flexible substrate FSU may comprise a material that is highly stretchable and flexible. In some cases, they are preferably made of a transparent material. Even if the unit pixel substrates USU have no flexibility, they may not be on the same plane, but instead may be arranged at a given angle or overlaid on each other thanks to the stretchability and flexibility of the flexible medium FF and flexible substrate FSU. That is, although the entire display panel may be basically rectangular, the unit pixel substrates USU do not have a fixed shape, but may be freely folded, flexed, bent, or overlaid on each other.

Figure 3A:
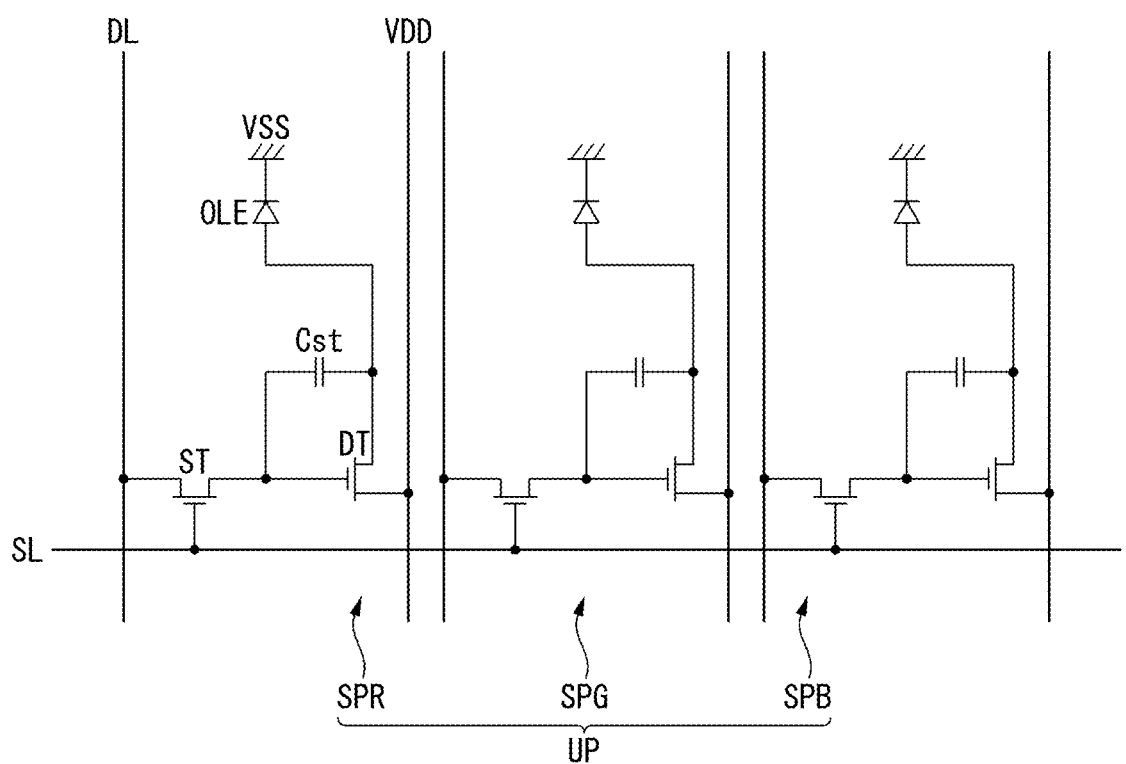
FIG. 3A is a circuit diagram illustrating a schematic structure of a unit pixel of the free-form organic light-emitting diode display according to the disclosure.
Figure 3B:
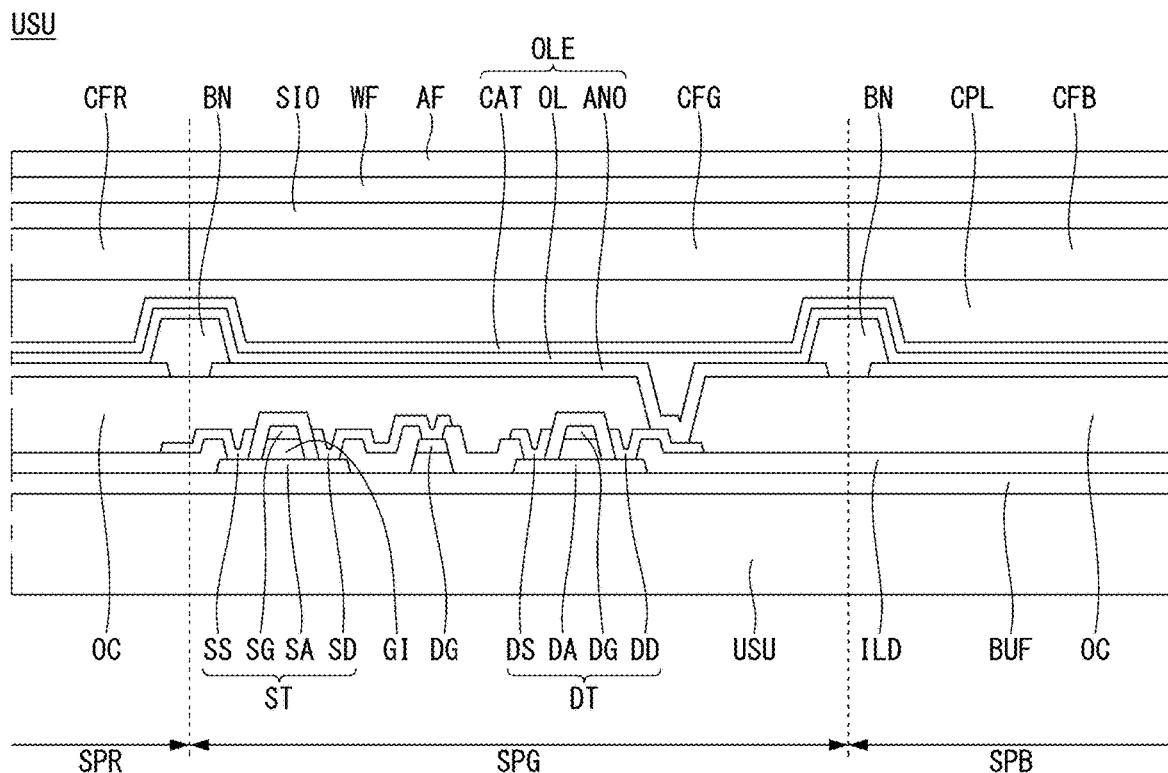
FIG. 3B is a cross-sectional view illustrating a unit pixel structure of the free-form organic light-emitting diode display according to the disclosure.

Hereinafter, a detailed structure of a free-form organic light-emitting diode display according to an exemplary embodiment of the present disclosure will be described with reference to FIGS. 3A and 3B. FIG. 3A is a circuit diagram of a schematic structure of a unit pixel of the free-form organic light-emitting diode display according to the disclosure. FIG. 3B is a cross-sectional view of the unit pixel structure of the free-form organic light-emitting diode display according to the disclosure.

First of all, referring to FIG. 3A, the unit pixel substrate USU of the free-form organic light-emitting diode display according to the disclosure comprises a switching thin-film transistor ST, a driving thin-film transistor DT, an auxiliary capacitor Cst, and an organic light-emitting diode OLE.

The switching thin-film transistor ST is switched to store a data signal supplied through a data line DL as a data voltage in the auxiliary capacitor Cst, in response to a scan signal supplied through a scan line SL. The driving thin-film transistor DT is operated to allow a drive current to flow between a power supply line VDD and a ground line VSS according to the data voltage stored in the auxiliary capacitor Cst. The organic light-emitting diode OLE emits light in response to the drive current formed by the driving thin-film transistor DT.

The switching thin-film transistor ST has a source electrode connected to the data line DL and a drain electrode connected to a gate electrode of the driving thin-film transistor DT. The driving thin-film transistor DT has a source electrode connected to the power supply line VDD and a drain electrode connected to an anode of the organic light-emitting diode OLE. The auxiliary capacitor Cst has a first electrode connected to the gate electrode of the driving thin-film transistor DT and the drain electrode of the switching thin-film transistor ST, and a second electrode connected to the anode of the organic light-emitting diode OLE.

The anode of the organic light-emitting diode OLE is connected to the drain electrode of the driving thin-film transistor DT, and a cathode of the organic light-emitting diode OLE is connected to the ground line VSS.

Although FIG. 3A illustrates an example in which a pixel has a 2T (transistor) 1C (capacitor) structure that comprises a switching thin-film transistor ST, a driving thin-film transistor DT, an auxiliary capacitor Cst, and an organic light-emitting diode OLE, the pixel may have a 3T2C, 4T2C, 5T1C, or 6T2C structure if a compensation circuit is added.

Next, referring again to FIG. 3B, the cross-sectional structure will be described. A buffer layer BUF is applied over the top surface of the unit pixel substrate USU. A switching semiconductor layer SA and a driving semiconductor layer DA are formed on the buffer layer BUF. A switching gate electrode SG is placed on a center of the switching semiconductor layer SA, with a gate insulating film GI therebetween. The overlapping region of the switching semiconductor layer SA and the switching gate electrode SG is a channel region. A driving gate electrode DG is placed on a center of the driving semiconductor layer DA, with the gate insulating film GI therebetween. The overlapping region of the driving semiconductor layer DA and the driving gate electrode DG is a channel region.

An intermediate insulating film ILD covers the gate electrodes SG and DG and the semiconductor layers SA and DA. A switching source electrode SS, a switching drain electrode SD, a driving source electrode DS, and a driving drain electrode DD are formed on the intermediate insulating film ILD. The switching source electrode SS makes contact with one side of the switching semiconductor layer SA. The switching drain electrode SD makes contact with the other side of the switching semiconductor layer SA. One side and the other side of the switching semiconductor layer SA face each other, with the channel region therebetween, where the switching semiconductor layer SA and the switching gate electrode SG overlap. Also, the driving source electrode DS makes contact with one side of the driving semiconductor layer DA. The driving drain electrode DD makes contact with the other side of the driving semiconductor layer DA. One side and the other side of the driving semiconductor layer DA face each other, with the channel region therebetween, where the driving semiconductor layer DA and the driving gate electrode DG overlap.

A planarization film OC, which lies over the switching thin film transistor ST and the driving thin film transistor DT, covers the entire surface of the unit pixel substrate USU. An anode ANO is formed over the planarization film OC. The anode ANO is connected to the driving drain electrode DD of the driving thin-film transistor DT via a contact hole formed in the planarization film OC.

A bank BN is formed over the anode ANO. The bank BN has an opening that exposes most of the center of the anode ANO. The opening defines a light-emitting area. An organic emission layer OL and a cathode CAT are stacked consecutively over the bank BN and the anode ANO. In the opening, an organic light-emitting diode OLE is formed by sequentially stacking the anode ANO, the organic emission layer OL, and the cathode CAT.

A passivation film CPL is bonded to an entire top surface of the unit pixel substrate USU where the organic light-emitting diode OLE is formed. The passivation film CPL is a passivation layer for preventing foreign materials such as moisture and air from getting into the organic light-emitting diode OLE.

A red color filter CFR, a green color filter CFG, and a blue color filter CFB are formed over the passivation film CPL. These color filters may be formed under the passivation film CPL. The red color filter CFR is positioned to correspond to the organic light-emitting diode OLE of the red sub-pixel SPR. The green color filter CFG is positioned to correspond to the organic light-emitting diode OLE of the green sub-pixel SPG. The blue color filter CFB is positioned to correspond to the organic light-emitting diode OLE of the blue sub-pixel SPB.

An inorganic passivation film SIO is stacked over the color filters CFR, CFG, and CFB. Although not shown, an ultraviolet absorbing resin layer may be interposed between the inorganic passivation film SIO and the color filters CFR, CFG, and CFB. Alternatively, the color filters CFR, CFG, and CFB may comprise an ultraviolet absorbing material.

A water-repellent layer WF is stacked over the inorganic passivation film SIO. The water-repellent layer WF is a coating layer for letting moisture easily run off the free-form organic light-emitting diode display, preventing moisture from sticking to the free-form organic light-emitting diode display.

An antifouling film AF is bonded onto the water-repellent layer WF. The water-repellent film AF is a passivation layer or film for preventing the adsorption of impurities. For example, the antifouling film AF is a passivation film for preventing fingerprints from being left on the surface of the free-form organic light-emitting diode display.

Herein, it is desirable that the water-repellent layer WF and the antifouling film AF are stacked on the top layer of the entire display device, rather than on the top layer of each unit pixel substrate USU. Preferably, the water-repellent layer WF and the antifouling film AF are positioned to cover the entire top surface of the flexible substrate FSU comprising both the unit pixel substrate USU and the flexible medium FF. When stacked on the entire top surface of the flexible substrate FSU, the water-repellent layer WF and the antifouling film AF may be preferably made of a material that at least has the same stretchability and flexibility as the flexible medium FF and the flexible substrate FSU.

Hereinafter, referring to FIGS. 4A to 4F, a method for manufacturing the free-form organic light-emitting diode display according to the embodiment of the disclosure will be described. FIGS. 4A to 4F are cross-sectional views of a manufacturing process of the free-form organic light-emitting diode display according to the present disclosure. If required, the description will be described with reference to the drawings and reference numerals in FIG. 3B.

Figure 4A:
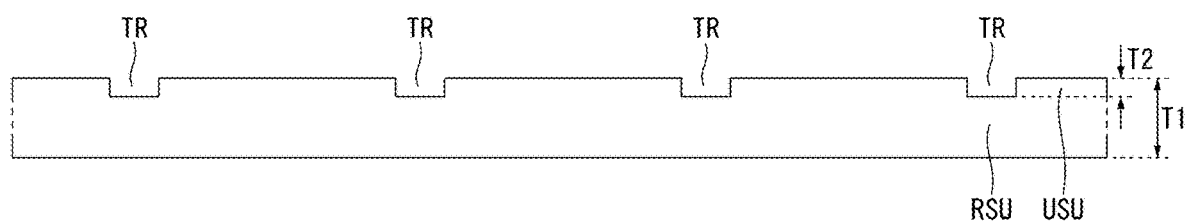
FIGS. 4A to 4F are cross-sectional views illustrating the manufacturing processes of the free-form organic light-emitting diode display according to the disclosure.

A rigid substrate RSU is prepared by using material such as glass, metal, and rigid plastic. The rigid substrate RSU has a first thickness T1. Preferably, the rigid substrate RSU has a rigidity suitable for the formation of thin-film transistors and organic light-emitting diodes. For example, if a glass substrate that is 0.5 mm thick is used in the manufacturing process of the organic light-emitting diode display, the first thickness T1 of the rigid substrate RSU may be 0.5 mm. Using a photolithography process, the rigid substrate RSU is etched to a depth equal to the second thickness T2 to form trenches TR. The protruding portions between the trenches TR define unit pixels USU. That is, the protruding portions between the etched areas of the rigid substrate RSU correspond to unit pixel substrates USU. The second thickness T2 corresponds to the thickness of the unit pixel substrates USU (FIG. 4A).

Figure 4B:
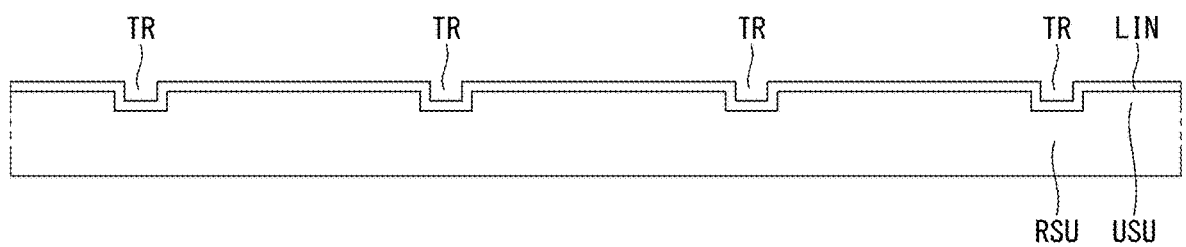

Connecting lines LIN are formed by applying a metal material over the top surface of the rigid substrate RSU where the unit pixel regions are defined, and patterning it by a masking process. The connecting lines LIN may comprise scan lines that run horizontally on the rigid substrate RSU, and data lines and drive current lines that run vertically on the rigid substrate RSU. The connecting lines LIN run across the top surfaces of the unit pixel substrates USU and trenches TR, and have shapes of line segments that are connected to one another on the surface of the rigid substrate RSU (FIG. 4B).

Figure 4C:
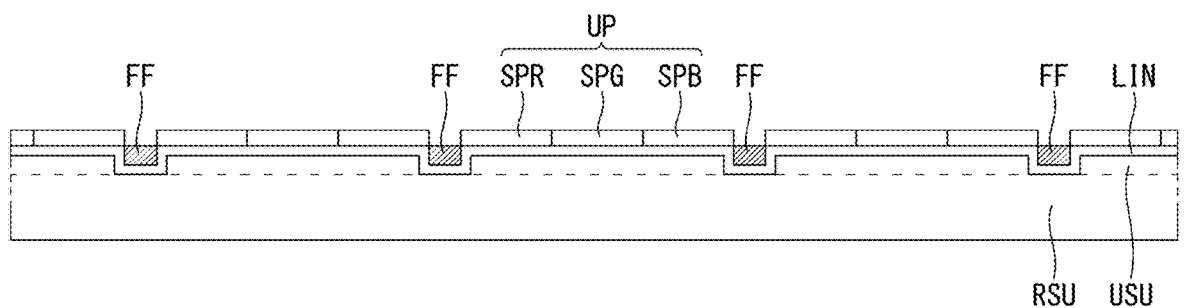

Driving elements comprising thin-film transistors are formed on the top surface of the rigid substrate RSU where the connecting lines LIN are formed. For example, switching thin-film transistors ST and driving thin-film transistors DT are formed, as shown in FIG. 3B. Preferably, even a planarization film OC covering the thin-film transistors ST and DT and anodes ANO are formed. As a result, red sub-pixels SPR, green sub-pixels SPG, and blue sub-pixels SPB are formed on the unit pixel substrates USU. Although the color filters have not yet been formed, it is still possible to distinguish the sub-pixels. Afterwards, a flexible medium FF is formed by filling an elastomeric polymer in the trenches TR (FIG. 4C).

Figure 4D:
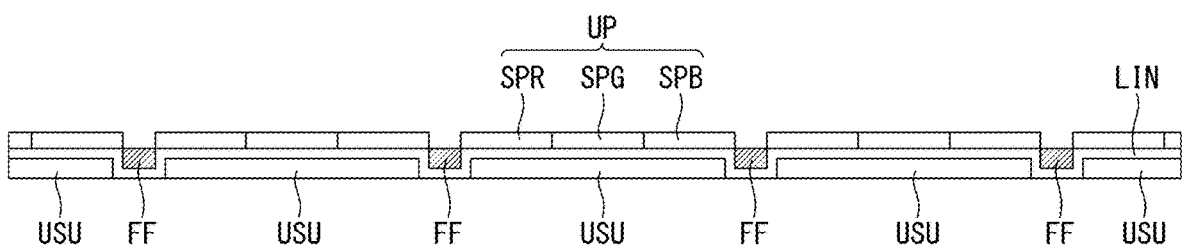

A back side of the rigid substrate RSU is etched to finish the unit pixel substrates USU. The back side of the rigid substrate RSU is cut away to a depth equal to the difference between the first thickness T1 and the second thickness T2. As a result, the unit pixel substrates USU are individually separated. However, the unit pixel substrates USU remain connected by the flexible medium FF. In this case, the connecting lines LIN may be exposed at the bottom of the flexible medium FF (FIG. 4D).

Figure 4E:
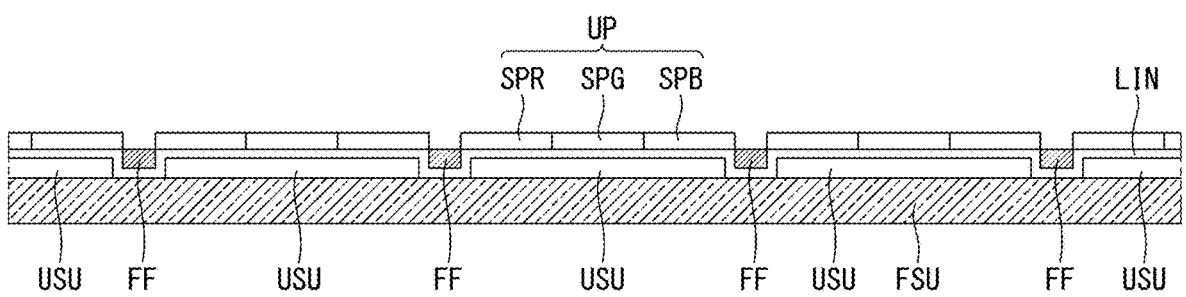
Figure 4F:
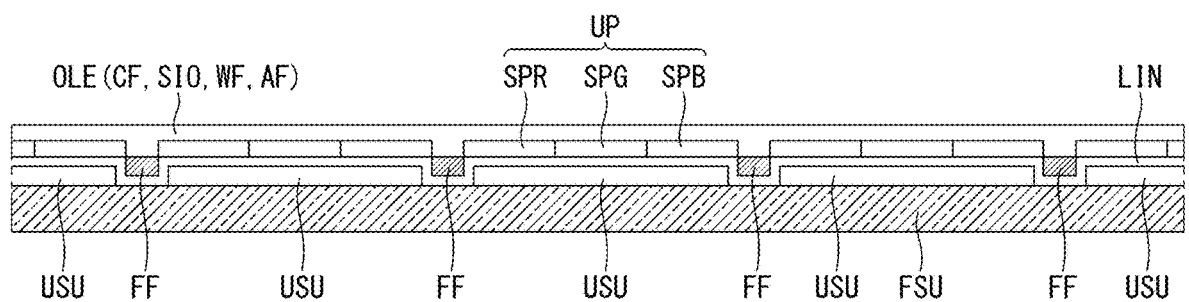

A flexible substrate FSU is formed by applying an elastomeric polymer to the back sides of the unit pixel substrates USU and connecting lines LIN exposed by etching the rigid substrate RSU. The flexible substrate FSU connects the unit pixel substrates USU together so that they are on the same plane. Moreover, the flexible substrate FSU covers the exposed connecting lines LIN. The parts of the connecting lines LIN that connect between the unit pixel substrates USU are protected as they are interposed between the flexible medium FF and the flexible substrate FSU (FIG. 4E).

Organic light-emitting diodes OLE are formed by forming banks BN on the unit pixel regions USU and sequentially stacking an organic emission layer OL and a cathode CAT. Afterwards, a passivation film CPL and color filters CFR, CFG, and CFB are formed. Then, an inorganic passivation film SIO is stacked. The individual unit pixel regions USU may be distinguished from one another, all the way to the inorganic passivation film SIO. Afterwards, a water-repellent layer WF and an antifouling film AF are stacked to cover the unit pixel regions USU and the flexible medium FF altogether. In some cases, the inorganic passivation film SIO as well may be formed to cover the unit pixel regions USU and the flexible substrate altogether. Consequently, the free-form organic light-emitting diode display is completed.

The free-form organic light-emitting diode display thus formed has individual substrates for each unit pixel UP—that is, unit pixel substrates USU. Also, the unit pixel substrates USU are connected by the flexible medium FF and the flexible substrate FSU. Thus, the display elements are not affected at all, even when the unit pixels are individually bent or folded, and may perform the display function properly.

Figure 5:
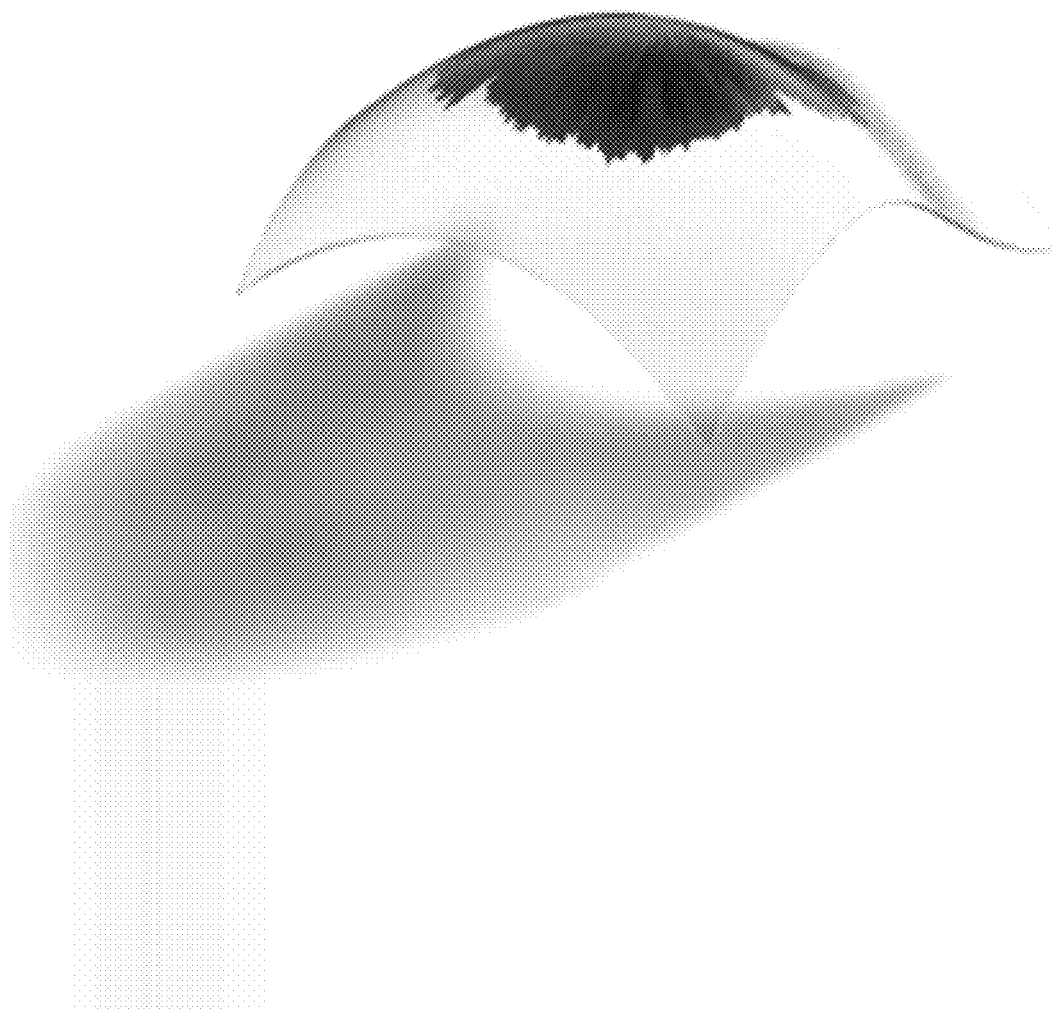
FIG. 5 is a full view of the free-form organic light-emitting diode display according to the present disclosure.

Such a free-form organic light-emitting diode display may alter its shape freely, as shown in FIG. 5. Moreover, the free-form organic light-emitting diode display has no problem at all with the display function even if it does not return to its original state. In addition, the free-form organic light-emitting diode display according to the disclosure may be worn as part of clothes, as if by being attached or fastened to a cloth or fabric. In this case, the user may wear clothes with the display function without any discomfort, and this makes the free-form organic light-emitting diode display a true wearable display. This wearable display becomes part of the user's clothes and maintains the display function properly even when bent or folded.

While the embodiment of the has been described in detail with reference to the drawings, it will be understood by those skilled in the art that the disclosure can be implemented in other specific forms without changing the technical spirit or essential features of the disclosure. Therefore, it should be noted that the forgoing embodiments are merely illustrative in all aspects and are not to be construed as limiting the disclosure. The scope of the disclosure is defined by the appended claims rather than the detailed description of the disclosure. All changes or modifications or their equivalents made within the meanings and scope of the claims should be construed as falling within the scope of the disclosure.

What is claimed is:

1. A free-form display comprising:
    a flexible substrate;
    a plurality of unit pixel substrates arranged in a matrix on the flexible substrate;
    a flexible medium that fills gaps between the unit pixel substrates;
    a passivation layer on the plurality of unit pixel substrates;
    an ultraviolet absorbing resin layer on the passivation layer;
    an inorganic passivation layer on the ultraviolet absorbing resin layer;
    a water-repellent layer on the inorganic passivation layer, and over the plurality of unit pixel substrates and an entire top surface of the flexible medium; and
    an antifouling film on the water-repellent layer.

2. The free-form display of claim 1, further comprising connecting lines that are stacked between the flexible substrate and the flexible medium and connect the unit pixel substrates.

3. The free-form display of claim 1, wherein a single unit pixel is placed in each of the unit pixel substrates.

4. The free-form display of claim 3, wherein the single unit pixel comprises at least three sub-pixels.

5. The free-form display of claim 4, wherein each one of the sub-pixels comprises:
    an organic light-emitting diode; and
    a thin-film transistor that drives the organic light-emitting diode.

6. The free-form display of claim 4, wherein the three sub-pixels comprise:
   a red sub-pixel;
   a green sub-pixel; and
   a blue sub-pixel.

* * * * *